United States Patent
Eker et al.

(10) Patent No.: US 6,642,781 B1
(45) Date of Patent: Nov. 4, 2003

(54) SELECTABLE EQUALIZATION SYSTEM AND METHOD

(75) Inventors: Mehmet M. Eker, Santee, CA (US); Wei Fu, San Diego, CA (US); Joseph J. Balardeta, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/236,761

(22) Filed: Sep. 6, 2002

Related U.S. Application Data

(62) Division of application No. 09/771,241, filed on Jan. 26, 2001, now Pat. No. 6,469,574.

(51) Int. Cl.[7] .................................................. H03B 1/00
(52) U.S. Cl. ....................................................... 327/555
(58) Field of Search ................................ 327/231, 234, 327/235, 237, 246, 252, 553, 555, 556, 557, 558, 559

(56) References Cited

U.S. PATENT DOCUMENTS

| | | | |
|---|---|---|---|
| 4,151,472 A | * | 4/1979 | Watanabe et al. ........... 327/553 |
| 4,480,236 A | * | 10/1984 | Harris ........................ 333/174 |
| 4,853,802 A | | 8/1989 | Kukson et al. |
| 4,945,311 A | | 7/1990 | Smith |
| 5,325,317 A | | 6/1994 | Petersen et al. |
| 5,604,927 A | | 2/1997 | Moore |
| 5,694,422 A | | 12/1997 | Kaku et al. |
| 5,701,099 A | | 12/1997 | Shafir |
| 5,880,626 A | | 3/1999 | Dean |
| 5,978,415 A | | 11/1999 | Kobayashi et al. |
| 6,310,512 B1 | | 10/2001 | Briskin et al. |
| 6,335,656 B1 | | 1/2002 | Goldfarb et al. |

* cited by examiner

*Primary Examiner*—Jeffrey Zweizig
(74) *Attorney, Agent, or Firm*—Incaplaw; Terrance A. Meador

(57) ABSTRACT

A system and method have been provided for selectably equalizing an input signal to an integrated circuit (IC), to compensate for degradation in the transmission process. The selectable equalization circuit includes parallel equalizing and non-equalizing sections. When the equalizing section is engaged a resonant element modifies the circuit impedance to add a zero to the circuit transfer function. When the non-equalizing function is engaged, the equalizing section is disengaged without degrading gate capacitance, and the input signals are processed without a zero in the transfer function.

6 Claims, 4 Drawing Sheets

SELECTABLE EQUALIZATION SYSTEM AND METHOD

RELATED APPLICATION

This application is a divisional of U.S. patent application Ser. No. 09/771,241, filed Jan. 26, 2001 U.S. Pat. No 6,469,574.

BACKGROUND OF THE INVENTION

1. Field of the Invention

This inventions relates generally to communication receiver circuitry and, more particularly, to a system and method for selectively equalizing the frequency response of received communications signals in an integrated circuit (IC) receiver.

2. Description of the Related Art

As high-speed random data travel through an air or transmission line medium on their way to a receiver circuit, the data can become distorted with respect to time. This distortion is due to the non-ideal response of the medium to the different frequencies of the data stream. Typically, higher frequency information suffers the worst degradation. Correcting this distortion can, therefore, be a critical function in the performance data recovery circuits (DRC). That is, optimal performing receiver circuits must be capable of correcting for the medium-induced frequency roll-off.

It is well known to design systems with the goal of making the gain response of the system transfer function flat across a critical range of frequencies, with a desired phase margin of 180 degrees (in the parlance of Bode plot analysis). However, such a transfer function is difficult to achieve. To counteract gain roll-off and phase shifting, the amplitude of the transfer function can be peaked at higher frequencies, and the slope of the phase change modified by using a resistor and capacitor pair (RC) of components to generate an additional so-called "zero" in the transfer function. Thus, a zero can be used to compensate for the degradation of the high frequency portions of an input signal. It is also known to design a resonant zero using passive circuits, or active circuits using a transistor or a differential pair of transistors.

A zero can also be added to the transfer function of a system to counteract higher frequency degradation in the transmission of a signal. The zero compensates by increasing the gain in the region of the zero frequency. However, the additional of a zero to the transfer function comes at the price of added group delay, which can also degrade received communications. Further, if the input is not degraded during transmission, the additional zero tends to accentuate high frequency components of the input signal at the expense of the low frequency components.

It would be advantageous if an equalization circuit at the input of a receiver IC could be engaged to compensate for amplitude and phase degradation in specific frequency ranges.

It would be advantageous if the above-mentioned equalization circuit could be selectably engaged.

It would be advantageous if a plurality of equalization sections could be engaged to compensate for different ranges of high frequency amplitude and phase degradation.

It would be advantageous if the above-mention plurality of equalization circuits could be selectively engaged to provide a plurality of selectable equalization ranges, or not engaged in situations where degradation is not present.

SUMMARY OF THE INVENTION

Accordingly, a selectably engagable equalization circuit is provided that functions by enabling one of two differential transistor pairs. The transistor pair that enables the frequency equalization function has a source degeneration impedance which is essentially one resistor in parallel with one capacitor. The parallel-connected RC network at the source results in a zero in the transfer function of the circuit. This zero is used to compensate for degraded phase. In addition, the magnitude response of the transfer function increases at frequencies above the zero frequency. Therefore, the circuit also compensates for amplitude degradation.

One unique feature of the circuit is that the transistor pair enabling the equalization function can be easily disabled, while a parallel non-equalizing transistor pair processes the input signal. Other circuitry features insure that the equalization transistor pair is completely off when the circuit is in the non-equalization mode, and that the source current for the equalization and non-equalization transistor pairs remains constant.

Additional details of the above-described selectable equalization circuit and a method for selectably equalizing an input signal to an IC receiver are described below.

DETAILED DESCRIPTION OF THE PREFERRED EMBODIMENTS

Figure 1:
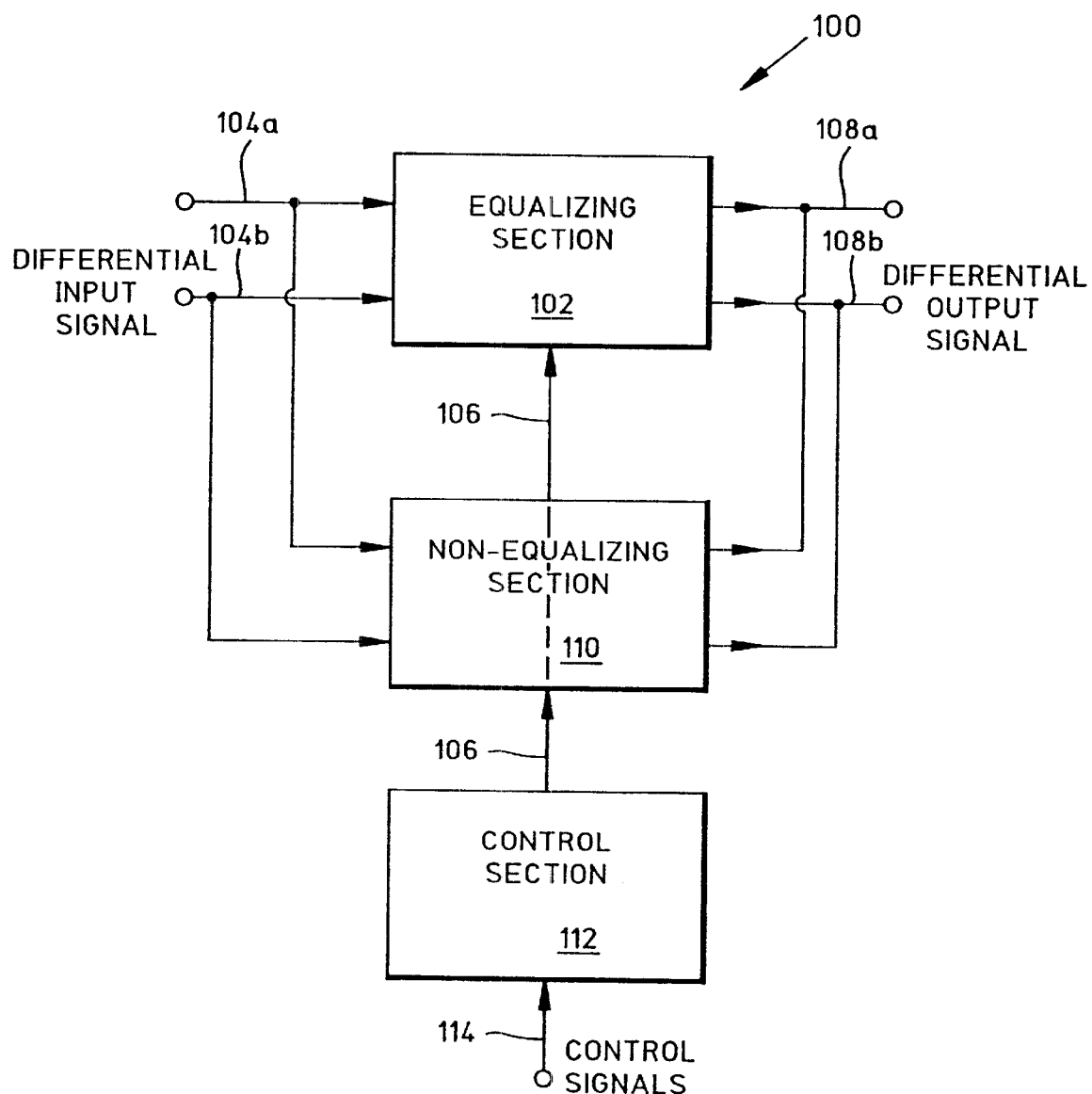
FIG. 1 is a schematic block diagram illustrating an integrated circuit (IC) selectably engagable equalization circuit.

FIG. 1 is a schematic block diagram illustrating an integrated circuit (IC) selectably engagable equalization circuit. The selectably engagable equalization circuit 100 comprises an equalizing section 102 having a differential signal input on lines 104a and 104b. The equalizing section 102 has a control input on line 106 responsive to control signals to selectively engage the equalizing section 102, and a differential signal output on lines 108a and 108b to supply an input signal at the output that has been processed with a second transfer function. The second transfer function can be considered a first transfer function, with the addition of a zero. The addition of the zero causes the input signal to undergo a high frequency amplitude "boost" at the zero frequency, when compared with the first transfer function.

The equalizing section 102, as well as the non-equalizing section presented below, is defined as buffer section that can be designed to generally provide voltage gain, current gain, unity gain, or even attenuation. Typically, such a buffer has a complex amplitude and phase response, called a transfer function, that rolls off at higher frequencies. That is, the amplitude or gain decreases at higher frequencies and the phase change approaches 180 degrees. A zero can be added to such a circuit so that the amplitude is increased and the phase shift diminished in a higher frequency region of the transfer function.

For example, even if the equalizing section 102 is designed for voltage gain, because of the overall amplitude and phase roll-off, the transfer function may still have little or no gain at a first frequency. The use of a zero at the first frequency increases the amplitude gain at the first (zero) frequency.

In the present invention a zero is added, not necessarily to compensate for inadequacies in the roll-off response of the buffer, but to compensate for high frequency degradation that occurs prior to the equalization section 102. Thus, the equalizing section 102 may generally have a flat gain, which is the first transfer function, with a peaked amplitude response at the zero frequency. Alternately, the equalizing section 102 may have a gain that rolls off at higher frequencies, with the zero diminishing the amplitude roll-off at the zero frequency.

A non-equalizing section 110 has a differential signal input on lines 104a and 104b and a control input on line 106 responsive to select signals to selectively engage the non-equalizing section. The non-equalizing section 110 supplies a differential signal output on lines 108a and 108b. The input signal is processed with the first transfer function, or without the additional zero that is added to the second transfer function of the equalizing section 102. Thus, when the input signal is not degraded, and high frequency compensation is not required, the non-equalizing section 110 is used to process the signal.

A control section 112 has an output on line 106 connected to the control inputs of the non-equalizing section 110 and the equalizing section 102 to supply select signals. The control section 112 has an input on line 114 to accept control signals. The control section 112 supplies select signals on line 106 to select either equalizing section 102 or non-equalizing section 110 in response to the control signals on line 114.

Figure 2:
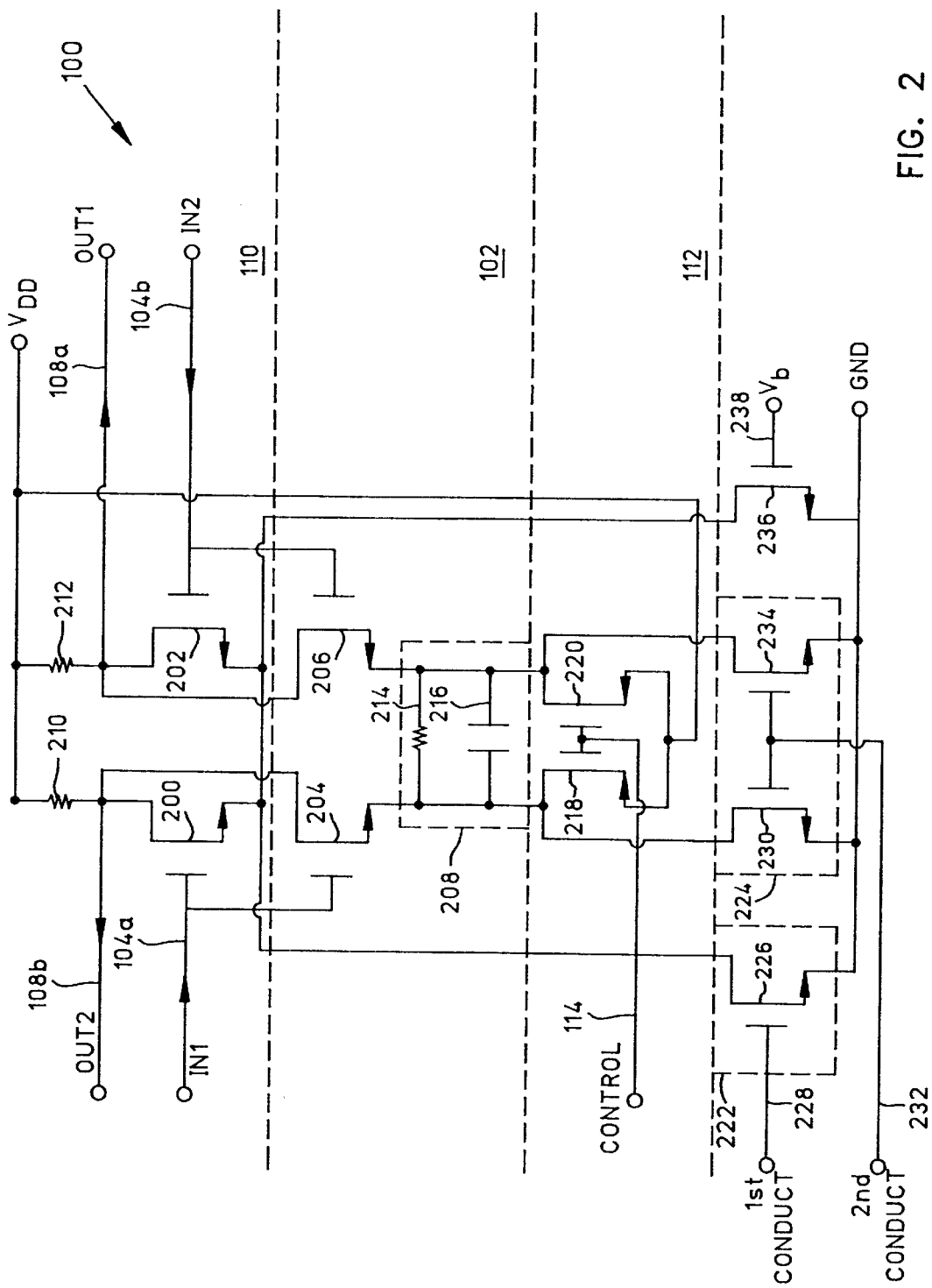
FIG. 2 is a schematic diagram illustrating details of the selectable equalization circuit of FIG. 1.

FIG. 2 is a schematic diagram illustrating details of the selectable equalization circuit 100 of FIG. 1. The non-equalizing section 110 includes a first pair of field effect transistors (FETs), first FET 200 and second FET 202 that are source-coupled. The first FET 200 has a gate to receive a first differential input signal (IN1) on line 104a and a drain to supply a second differential output signal (OUT2) on line 108b. The second FET 202 has a gate to receive a second differential input signal (IN2) on line 104b and a drain to supply a first differential output signal (QUT1) on line 108a.

The equalizing circuit 102 includes a second pair of FETs having sources, namely third FET 204 and a fourth FET 206. The third FET 204 has a gate to receive the first differential input signal on line 104a and a drain to supply the second differential output signal on line 108b. The fourth FET 206 has a gate to receive the second differential input signal on line 104b and a drain to supply the first differential output signal on line 108a.

A resonant element 208 is connected between the sources of the second pair of FETs 204/206. It is the resonant element that provides the zero in the second transfer function, as the impedance of the equalizing circuit 102 is peaked at the zero frequency, which is the frequency at which the resonant element 208 resonates.

A first load resistor 210 is interposed between the drain of the first FET 200 and a first voltage source ($V_{DD}$). A second load resistor 212 is interposed between the drain of the second FET 202 and the first voltage source. Likewise, the first load resistor is interposed between the drain of the third FET 204 and the first voltage source, and the second load resistor 212 is interposed between the drain of the fourth FET 206 and the first voltage source.

Although the resonant element 208 can be a crystal, SAW filter, inductor/capacitor combination, or other high Q resonant material, it is typical that the resonant element 208 includes a resistor 214 having a first end connected to the source of the third FET 204 and a second end connected to the source of the fourth FET 206. A capacitor 216 has a first end connected to the source of the third FET 204 and a second end connected to source of the fourth FET 206.

The control section 112 includes a fifth FET 218 having a source connected to the first voltage source, a drain connected to the source of the third FET 204, and a gate to receive the control signal. A sixth FET 220 has a source connected to the first voltage source, a drain connected to the source of the fourth FET 204, and a gate to receive the control signal on line 114. The control signal on line 114 causes the fifth and sixth FETs 218/220 to conduct. When this occurs, the sources of the third and fourth FETs 204/206 are brought close to $V_{DD}$, so that the third and fourth FETs 204/206 do not conduct. Thus, the equalizing section 102 is not engaged.

A first current source 222 is connected to the sources of first pair of FETs 200/202. A second current source 224 is connected to the sources of the second pair of FETs 204/206. The first and second current sources 222/224 can be enabled through a variety of equivalent circuits. Some examples of current sources circuits are provided below.

The first current source 222 includes a seventh FET 226 having a drain connected to the sources of the first and second FETs 200/202, a source connected to a second voltage source (ground), and a gate connected to receive a first conduct signal on line 228. The first conduct signal on 228 causes the seventh FET 226 to conduct, which in turn permits the first and second FETs 200/202 to conduct, and the non-equalizing section 110 to operate. The first conduct signal on line 228 occurs simultaneously with the control signal 114, which disables equalizing section 102.

The second current source 224 includes an eighth FET 230 having a drain connected to the source of the third FET 204, a source connected to a second voltage source, and a gate connected to receive a second conduct signal on line 232. A ninth FET 234 has a drain connected to the source of the fourth FET 206, a source connected to a second voltage source, and a gate connected to receive the second conduct signal on line 232. The second conduct signal on line 232 causes the eighth and ninth FETs 230/234 to conduct. The second conduct signal on line 232 occurs when the first conduct signal is not present on line 228. That is, when the first current source 222 is not enabled, the second current source 224 is. Likewise, when the second current source 224 is not enabled, the first current source 222 is.

However, even when the first current source 222 is not enabled, it is still biased to a degree. A tenth bias FET 236 has a drain connected to the sources of the first and second FETs 200/202, a source connected to a second voltage source, and a gate connected to receive the bias voltage on line 238.

The operation of the circuit can be explained as follows: The first and second transistors 200 and 202 form the non-equalizing section 110, and they work in cooperation with seventh and tenth transistors 222 and 236. In some aspects of the invention, first, second, seventh, and tenth transistors 200/202/222/236 are N-type FETs. However, the circuit 100 of the present invention is not limited to an specific type of FET transistor. In fact, the concept of the invention could easily be implemented using bipolar transistors or PFETs. A constant reference voltage $V_b$ biases the tenth FET 236. Due to the tenth FET 236, the first and second FETs 200/202 are always at least partially conducting. When no equalization is required, the second conduct signal on line 232 is biased by the ground voltage, turning off the eighth and ninth FETs 230 and 234, which are also NMOS FETs for the purposes of the present example. At the same time, the first conduct signal on line 228 is biased by a reference voltage equivalent to $V_b$, and the control signal on line 114 is biased by the ground voltage. As the eighth and ninth FETs 230/234 are off, the third and fourth FETs 204/206, also NMOS for the purposes of this example, cannot conduct any current, even if their gate voltages go high arbitrarily with the input signal on lines 104a and 104b. To prevent increased gate capacitances in the third and fourth FET channels, the sources of the third and fourth FETs 204/206 are pulled to $V_{DD}$, through the fifth and sixth transistors 218/220, which are PMOS FETs in the present example. Grounding the control signal on line 114 ensures that the turned-on fifth and sixth FETs 218/220 pull the sources of the third and fourth FETs 204/206 to the first voltage $V_{DD}$. This voltage control further insures that the third and fourth FETs 204/206 are off regardless of the gate voltages, resulting in smaller gate capacitances.

The maximum current that can flow through the first load resistor 210, is the sum of the bias currents of the seventh and tenth FETs 226/236. This maximum current is constant and determines the voltage swing at the outputs.

When equalization is required, the first conduct signal on line 228 is grounded, the second conduct signal on line 232 set to bias voltage $V_b$, and the control signal on line 114 is set to $V_{DD}$. As a result, the fifth, sixth, and seventh FETs 218/220/236 are turned off and the eighth and ninth FETs 230/234 are turned on. In this mode, the fifth and sixth FETs 218/220 no longer pull the sources of the transistors third and fourth FETs 204/206 to $V_{DD}$, and act as an open-circuit. The first, second, third, and fourth FETs 200/202/204/206 are all active, but the total biasing current (sum of the biasing currents of the eighth, ninth, and tenth FETs 230/234/236) is still the same as in the non-equalizing mode, to keep the voltage swing at the outputs 108a and 108b unchanged. Since the third and fourth FETs 204/206 are active, the equalizing effect of the resistor 214 with the capacitor 216 is engaged.

Figure 3:
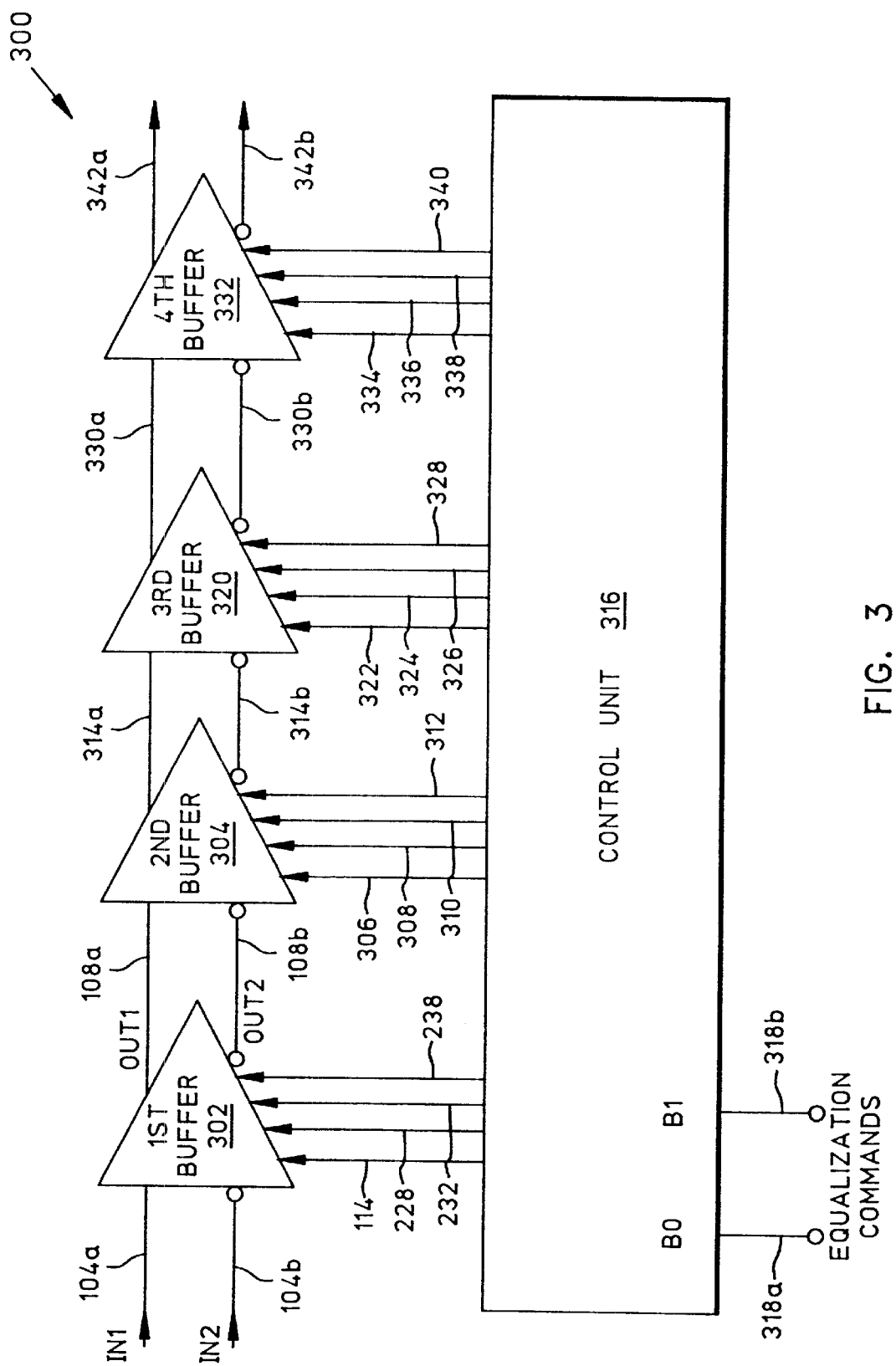
FIG. 3 is a schematic block diagram of an IC selectable input equalization system.

FIG. 3 is a schematic block diagram of an IC selectable input equalization system. The system 300 comprises a first buffer 302 having an input connected to a signal input of the IC on lines 104a and 104b. The first buffer 302 has a control input on line 114 and a signal output on lines 108a and 108b to selectably supply an equalized output in response to commands to the control input. The first buffer is the selectably engagable equalization circuit 100 of FIGS. 1 and 2. In addition to the control signal on line 114. The first buffer 302 accepts the first conduct signal on line 228, the second conduct signal on line 232, and the bias signal on line 238.

A second buffer 304 has an input connected to the signal output of the first buffer on lines 108a and 108b. The second buffer 304 has a control input to accept the control signal on line 306, the first conduct signal on line 308, the second conduct signal on line 310, and the bias signal on line 312. The second buffer 304 has a signal output on lines 314a and 314b to selectably supply an equalized output in response to commands to the control input. The operation of the second buffer 304 is substantially the same as the first buffer 302.

A control unit 316 has an input on lines 318a and 318b to accept equalization commands. The control unit 316 has a first output connected to the control input of the first buffer 302 on lines 114, 228, 232, and 238, and a second output connected to the control input of the second buffer 304 on lines 306, 308, 310, and 312 to supply selection commands.

A third buffer 320 has an input connected to the signal output of the second buffer on lines 314a and 314b. The third buffer 320 has a control input to accept the control signal on line 322, the first conduct signal on line 324, the second conduct signal on line 326, and a bias voltage on line 328. The third buffer 320 has a signal output on lines 330a and 330b to selectably supply an equalized output in response to commands to the control input.

A fourth buffer 332 has an input connected to the signal output of the third buffer on lines 330a and 330b. The fourth buffer 332 has a control input to accept the control signal on line 334, the first conduct signal on line 336, the second conduct signal on line 338, and a bias voltage on line 340. The fourth buffer 332 has a signal output on lines 342a and 342b to selectably supply an equalized output in response to commands to the control input.

The control unit 316 supplies selection signals (control signal, first and second conduct signals, and bias voltage) to the third and fourth buffers 320/332 as it does to the first and second buffers 302/304. That is, the control unit 316 has a third output connected to the control input of the third buffer 320 and a fourth output connected to the control input of the fourth buffer 332 to supply selection commands.

Typically, the signal inputs and signal outputs are differential signals, as shown. However, the invention can be realized with ground referenced input signals. Further, in some aspects, the control unit 316 accepts digital logic equalization commands on lines 318a and 318b. Four stages of selectable equalization can be controlled in response to two bits of equalization commands. For example, 00 can represent no equalization, 01 can represent one stage of equalization, 10 can represent two stages of equalization, and 11 can represent three stages of equalization. A third bit (318c, not shown) would be required to control a fourth stage of equalization. It should be noted that order in which the equalization stages are engaged is arbitrary. That is, the first buffer 302 need not turn on first, the second buffer 304 need not turn on second, and the third buffer 320 need not turn on third. The control unit 316 can be designed to turn the buffers in a different order. Further, the degree of equalization provided by each stage is not necessarily the same. That is, the zero frequency is not necessarily the same for all the buffers.

For example, in some aspects of the invention, the first buffer 302 selectable supplies a signal output shifted a first phase with respect to the signal input, and the second buffer 304 selectable supplies a signal output shifted a second phase with respect to the signal input. The first and second phase shift, or zero frequency may, or may not, be the same.

For example, the 2-bit control unit simultaneously sets the biasing conditions of each of the buffers. There are four possible modes of operations: (1) Option #1—no equalization condition is selected for the first three buffers; (2) Option #2—equalization is selected for the first buffer 302, and no-equalization is selected for the second and third buffers 304/320; (3) Option #3—equalization is selected for the first and second buffers 302/304, and no equalization is selected for the third buffer 320; and, (4) Option #4—equalization is selected for the first three buffers 302/304/320. The fourth buffer 332 is provided to illustrate that the present invention system is not limited to just three buffer sections. With respect to the fourth buffer 332, a third bit of equalization command control would be required for control.

The control unit 316 is a switched biasing network controlled digitally by B0 and B1 bits. The truth table for the control unit 316 is given in Table 1. Note, the bias voltage on lines 238, 312, 328, and 340 is always present, the control signal is represented by the symbol "C", the first conduct signal is represented by "First CS", and the second conduct signal by "Second CS".

TABLE 1

Control Unit Truth Table

| B1 | B0 | C1 | First CS | Second CS | C2 | First CS2 | Second CS2 | C3 | First CS3 | Second CS3 |
|----|----|----|----|----|----|----|----|----|----|----|
| 0 | 0 | gnd | gnd | $V_{bias}$ | gnd | gnd | $V_{bias}$ | gnd | gnd | $V_{bias}$ |
| 0 | 1 | $V_{dd}$ | $V_{bias}$ | gnd | gnd | gnd | $V_{bias}$ | gnd | gnd | $V_{bias}$ |
| 1 | 0 | $V_{dd}$ | $V_{bias}$ | gnd | $V_{dd}$ | $V_{bias}$ | gnd | gnd | gnd | $V_{bias}$ |
| 1 | 1 | $V_{dd}$ | $V_{bias}$ | gnd | $V_{dd}$ | $V_{bias}$ | gnd | $V_{dd}$ | $V_{bias}$ | gnd |

In some aspects of the invention, a final buffer is provided (not shown) to isolate the last selectable equalization buffer from a variable output load, and presenting a fixed, known load to the last selectable equalization buffer. In this manner, the equalization behavior of the circuit is not dependent upon the load.

Figure 4:
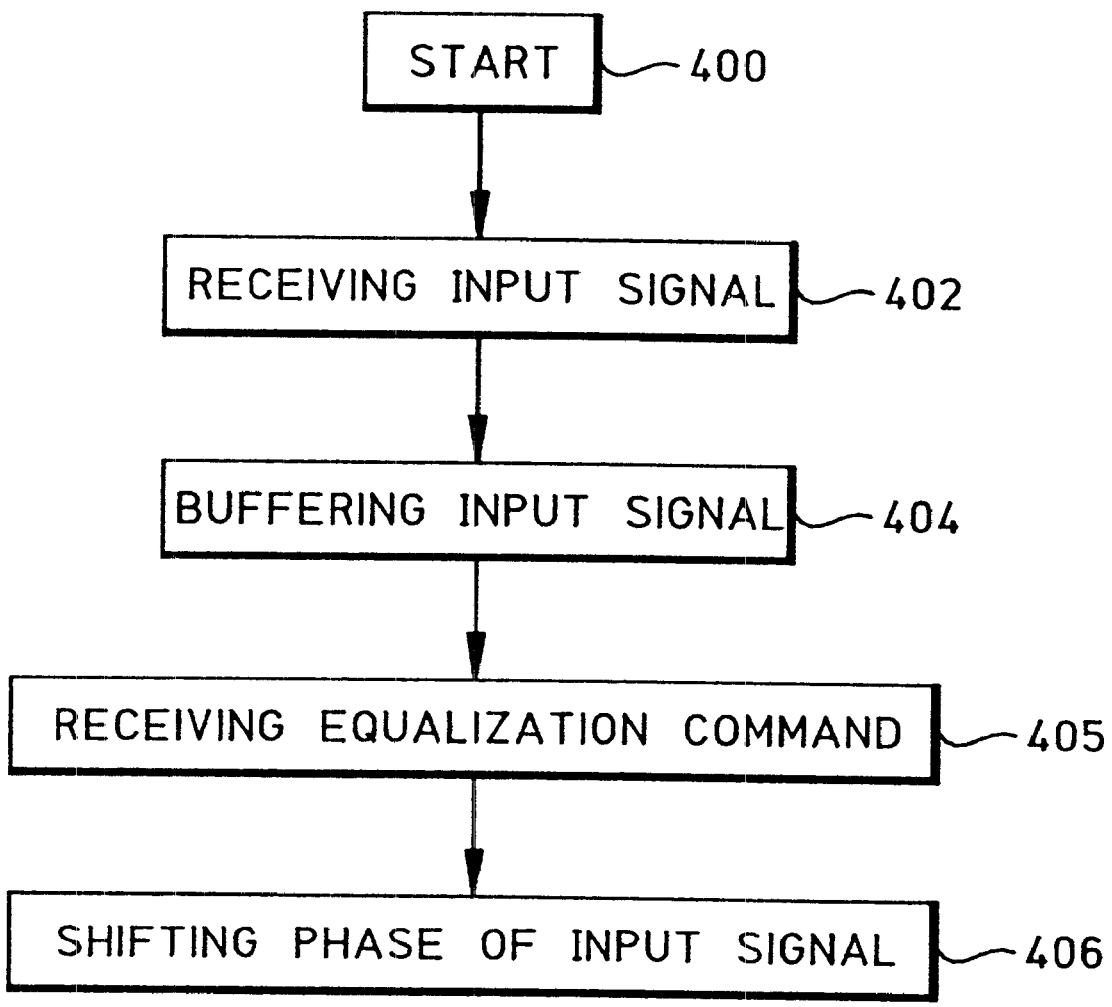
FIG. 4 is a flowchart illustrating a method for selectable equalizing input signals in an integrated circuit (IC).

FIG. 4 is a flowchart illustrating a method for selectable equalizing input signals in an integrated circuit (IC). Although the method is depicted as a sequence of numbered steps for clarity, no order should be inferred from the numbering unless explicitly stated. The method begins with Step 400. Step 402 receives an input signal. In some aspects of the invention, receiving an input signal in Step 402 includes receiving a differential input signal. Step 404 buffers the input signal in a plurality of stages. Step 406 selectably shifts the phase of the input signal in each of the buffer stages.

In some aspects of the invention, Step 405 receives an equalization command. Selectably shifting the phase of the input signal in each of the buffer stages in Step 406 includes selectably shifting the phase of the input signal in response to the equalization command.

In some aspects of the invention, selectably shifting the phase of the input signal in each of the buffer stages in Step 406 includes optionally shifting the input signal a first phase in each buffer stage.

In some aspects, buffering the input signal in a plurality of stages in Step 404 includes buffering the input signal in a first, second, and third stage. Then, selectably shifting the phase of the input signal in each of the buffer stages in Step 406 includes optionally shifting the input signal a first phase in the first buffer stage, a second phase in the second buffer stage, and a third phase in the third buffer stage.

A system and method have been provided for selectably supplying equalization to a signal input to an IC. The selection options are easily programmable. When not required, the equalization can be disabled, and the circuit behaves as an amplifier or buffer. Examples have been given of single zero equalization circuits. However, the present invention is not limited to any particular type of equalization. That is, the equalization response can be multiple zeros, a pole, multiple poles, poles and zeros, or a complex transfer function. Neither is the invention limited to any particular number of equalization sections. Although differential signal example have been provided, the invention is equally applicable to ground, or virtual ground referenced signals. Other variations and embodiments of the invention will occur to those skilled in the art.

We claim:

1. In an integrated circuit (IC), a selectable input equalization system comprising:

a first buffer having an input connected to a signal input of the IC, the first buffer having a control input and a signal output to selectably supply an equalized output in response to commands to the control input;

a second buffer having an input connected to the signal output of the first buffer, the second buffer having a control input and a signal output to selectably supply an equalized output in response to commands to the control input;

a third buffer having an input connected to the signal output of the second buffer, the third buffer having a control input and a signal output to selectably supply an equalized output in response to commands to the control input;

at least a fourth buffer having an input connected to the signal output of the third buffer, the fourth buffer having a control input and a signal output to selectably supply an equalized output in response to commands to the control input; and a control unit having an input to accept equalization commands, a first output connected to the control input of the first buffer to supply selection commands, a second output connected to the control input of the second buffer to supply selection commands, a third output connected to the control input of the third buffer to supply selection commands and a fourth output connected to the control input of the fourth buffer to supply selection commands;

wherein the signal input and signal output signals are differential signals; and wherein the control unit accepts digital logic equalization commands.

2. The system of claim 1 wherein the first buffer selectably supplies a signal output shifted a first phase with respect to the signal input; and wherein the second buffer selectably supplies a signal output shifted a second phase with respect to the signal input.

3. In an integrated circuit (IC), a method for selectably equalizing input signals, the method comprising:

receiving a differential input signal;

buffering the input signal in a plurality of stages; and selectably shifting the phase of the input signal in each of the buffer stages.

4. The method of claim 3 further comprising:

receiving an equalization command; and wherein selectably shifting the phase of the input signal in each of the buffer stages includes selectably shifting the phase of the input signal in response to the equalization command.

5. The method of claim 4 wherein selectably shifting the phase of the input signal in each of the buffer stages includes optionally shifting the input signal a first phase in each buffer stage.

6. The method of claim 5 wherein buffering the input signal in a plurality of stages includes buffering the input signal in a first, second, and third stage; and wherein selectably shifting the phase of the input signal in each of the buffer stages includes optionally shifting the input signal a first phase in the first buffer stage, a second phase in the second buffer stage, and a third phase in the third buffer stage.

* * * * *